United States Patent
Ohmae

(10) Patent No.: US 10,937,658 B2
(45) Date of Patent: *Mar. 2, 2021

(54) LED WAFER PROCESSING METHOD

(71) Applicant: DISCO CORPORATION, Tokyo (JP)

(72) Inventor: Makiko Ohmae, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/512,539

(22) Filed: Jul. 16, 2019

(65) Prior Publication Data

US 2020/0027739 A1 Jan. 23, 2020

(30) Foreign Application Priority Data

Jul. 20, 2018 (JP) .............................. JP2018-137058

(51) Int. Cl.
| | |
|---|---|
| *H01L 21/304* | (2006.01) |
| *B23K 26/38* | (2014.01) |
| *B23K 26/364* | (2014.01) |
| *B23K 26/40* | (2014.01) |
| *B28D 5/00* | (2006.01) |
| *H01L 21/67* | (2006.01) |
| *B23K 101/40* | (2006.01) |
| *B23K 103/00* | (2006.01) |

(52) U.S. Cl.
CPC ........ *H01L 21/3043* (2013.01); *B23K 26/364* (2015.10); *B23K 26/38* (2013.01); *B23K 26/40* (2013.01); *B28D 5/0005* (2013.01); *H01L 21/67092* (2013.01); *B23K 2101/40* (2018.08); *B23K 2103/56* (2018.08)

(58) Field of Classification Search
CPC ........... H01L 21/3043; H01L 21/67092; H01L 21/78; B28D 5/022–029
See application file for complete search history.

(56) References Cited

U.S. PATENT DOCUMENTS

| | | | |
|---|---|---|---|
| 2001/0011772 A1* | 8/2001 | Fukasawa | ........... H01L 23/3114 257/734 |
| 2004/0185639 A1* | 9/2004 | Fukuoka | .................... C09J 7/38 438/464 |

(Continued)

FOREIGN PATENT DOCUMENTS

| | | |
|---|---|---|
| JP | 10305420 A | 11/1998 |
| JP | 2002192370 A | 7/2002 |

*Primary Examiner* — Selim U Ahmed
*Assistant Examiner* — Evan G Clinton
(74) *Attorney, Agent, or Firm* — Greer Burns & Crain Ltd.

(57) ABSTRACT

An LED wafer is formed from a sapphire substrate having a front side. A plurality of crossing division lines are formed on the front side of the sapphire substrate to thereby define a plurality of separate regions where a plurality of LEDs are respectively formed. An LED wafer processing method includes preparing a V-blade having an annular cutting edge whose outer circumferential portion has a V-shaped cross section, rotatably mounting the V-blade in a cutting unit, holding the LED wafer on a holding table with the back side of the LED wafer exposed upward, and then relatively moving the cutting unit and the holding table to form a chamfered portion on the back side of the LED wafer along an area corresponding to each division line formed on the front side of the LED wafer.

14 Claims, 7 Drawing Sheets

(56) References Cited

U.S. PATENT DOCUMENTS

| | | | |
|---|---|---|---|
| 2011/0138857 A1* | 6/2011 | Numata | C03B 33/037 65/28 |
| 2015/0177558 A1* | 6/2015 | Sugihara | B32B 37/1284 174/261 |
| 2016/0133784 A1* | 5/2016 | Minamiru | H01L 33/0095 438/33 |

* cited by examiner

LED WAFER PROCESSING METHOD

BACKGROUND OF THE INVENTION

Field of the Invention

The present invention relates to a light-emitting diode (LED) wafer processing method for processing an LED wafer formed from a sapphire substrate, in which a plurality of LEDs are formed on the front side of the sapphire substrate so as to be separated from each other by a plurality of division lines.

Description of the Related Art

A plurality of crossing division lines are formed on the front side of a sapphire substrate to thereby define a plurality of separate regions where a plurality of LEDs are respectively formed, thus forming an LED wafer having the plural LEDs on the front side. The LED wafer is divided along the division lines by using a laser processing apparatus to obtain a plurality of individual LED chips respectively including the plural LEDs. The LED chips thus obtained are used in electrical equipment such as mobile phones and illumination equipment.

In general, a sapphire substrate has high hardness and much time is required for cutting of the sapphire substrate by using a cutting blade mounted in a cutting apparatus. Accordingly, it is difficult to efficiently divide the LED wafer into the individual LED chips by using a cutting blade. For this reason, a laser processing apparatus is used to divide the LED wafer into the individual LED chips.

It is known that such a laser processing apparatus for realizing the processing of a sapphire substrate may be classified into two types. One of the two types is such that a laser beam having an absorption wavelength to sapphire is applied to the sapphire substrate along each division line, thereby performing ablation along each division line to form a division groove (laser processed groove) along each division line (see Japanese Patent Laid-open No. Hei 10-305420, for example). The other type is such that a laser beam having a transmission wavelength to sapphire is first applied to the sapphire substrate along each division line, thereby forming a modified layer as a division start point inside the sapphire substrate along each division line, and an external force is next applied to the sapphire substrate to thereby divide the sapphire substrate along each division line (see Japanese Patent No. 3408805, for example). By using any type of laser processing apparatus, the LED wafer can be divided into the individual LED chips.

SUMMARY OF THE INVENTION

According to the above laser processing apparatus, the LED wafer formed from a sapphire substrate can be divided into the individual LED chips more efficiently as compared with the case of using a cutting blade. However, the side surface of each LED chip is modified by the application of a laser beam, causing a reduction in luminance of each LED chip.

It is therefore an object of the present invention to provide an LED wafer processing method which can improve the luminance of each LED chip.

In accordance with an aspect of the present invention, there is provided an LED wafer processing method for processing an LED wafer formed from a sapphire substrate having a front side, a plurality of crossing division lines being formed on the front side of the sapphire substrate to thereby define a plurality of separate regions where a plurality of LEDs are respectively formed, the LED wafer processing method including a V-blade preparing step of preparing a V-blade having an annular cutting edge whose outer circumferential portion has a V-shaped cross section; and a chamfering step of rotatably mounting the V-blade in cutting means, holding the LED wafer on a holding table in a condition where a back side of the LED wafer is exposed upward, and then relatively moving the cutting means and the holding table to form a chamfered portion on the back side of the LED wafer along an area corresponding to each division line formed on the front side of the LED wafer.

Preferably, the V-blade includes a plurality of V-blades having a plurality of annular cutting edges whose outer circumferential portions have different V-shaped cross sections such that the plurality of annular cutting edges of the plurality of V-blades have different tip angles, and the chamfering step is performed by stepwise mounting the plurality of V-blades in the cutting means to form a polygonal surface as the chamfered portion. More preferably, the plurality of V-blades include three kinds of V-blades having three kinds of cutting edges, and the different tip angles of the three kinds of cutting edges include a first tip angle of 110 to 130 degrees, a second tip angle of 80 to 100 degrees, and a third tip angle of 50 to 70 degrees. Preferably, the cutting edge of the V-blade contains diamond abrasive grains having an average grain size of #1800 to #2200.

Preferably, the depth of cut by the plurality of V-blades is stepwise increased in the chamfering step every time the V-blades are stepwise mounted in the cutting means, thereby cutting the back side of the LED wafer along each division line in plural stages. More preferably, the depth of cut to be stepwise increased in the chamfering step is set in a range of 0.04 to 0.06 mm per stage. Preferably, the LED wafer processing method further includes a division start point forming step of forming a division start point along each division line of the LED wafer before or after performing the chamfering step.

According to the present invention, the back side of the LED wafer is cut by the V-blade along each division line to form a chamfered portion. Accordingly, it is possible to improve the luminance of each LED chip obtained by dividing the LED wafer processed by this method. Further, in the case that the chamfering step is performed by using the plural V-blades having different tip angles, the chamfered portion can be made to form a pseudo curved surface as a polygonal surface.

Accordingly, the chamfered portion to be formed on the back side of each LED chip can be formed to have such a pseudo curved surface, so that the luminance of each LED chip can be further improved.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
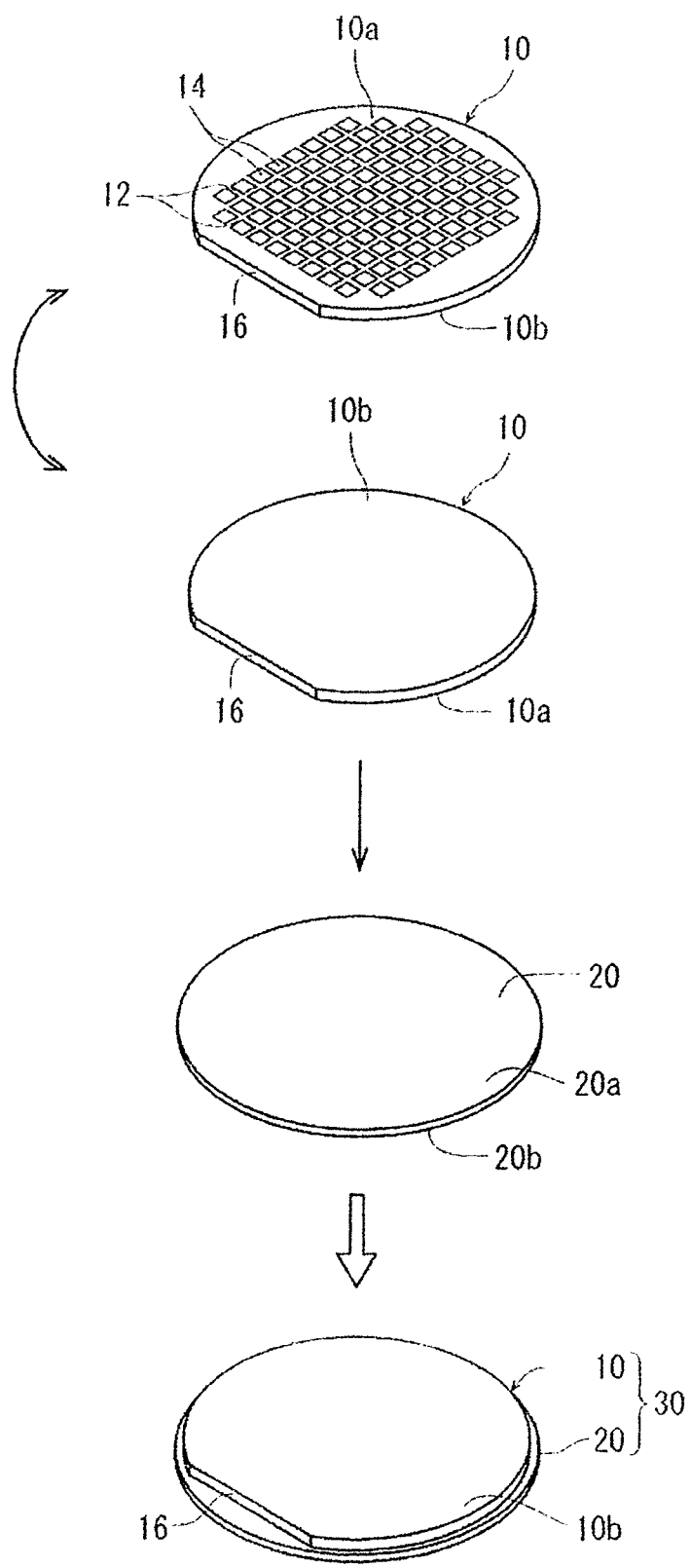
FIG. 1 is a perspective view illustrating a manner of attaching an LED wafer to a support substrate to thereby form a wafer unit.

There will now be described an LED wafer processing method according to a preferred embodiment of the present invention with reference to the attached drawings. In performing the LED wafer processing method according to this preferred embodiment, an LED wafer 10 as a workpiece is prepared as illustrated in FIG. 1. The LED wafer 10 is composed of a substantially circular sapphire substrate and a Gallium Nitride (GaN) layer formed on the front side (upper surface) of the sapphire substrate. The sapphire substrate has a thickness of 0.45 mm. The GaN layer is partitioned by a plurality of crossing division lines 12 to thereby define a plurality of separate regions where a plurality of LEDs 14 are respectively formed. The plural crossing division lines 12 are composed of a plurality of parallel division lines 12 extending in a first direction and a plurality of parallel division lines 12 extending in a second direction perpendicular to the first direction. The outer circumference of the LED wafer 10 is formed with a straight portion, i.e., so-called orientation flat 16 indicating crystal orientation. The LED wafer 10 has a front side 10a and a back side 10b opposite to the front side 10a, in which the LEDs 14 are formed on the front side 10a of the LED wafer 10.

After preparing the LED wafer 10, a disk-shaped support substrate 20 slightly larger in diameter than the LED wafer 10 is prepared as illustrated in FIG. 1. The support substrate 20 is a substrate having a predetermined rigidity, and it is formed of polyethylene terephthalate (PET), for example. As illustrated in FIG. 1, the support substrate 20 has a front side (upper surface) 20a and a back side (lower surface) 20b opposite to the front side 20a. The front side 10a of the LED wafer 10 is attached to the front side 20a of the support substrate 20 in the condition where the center of the LED wafer 10 coincides with the center of the support substrate 20, thereby forming a wafer unit 30 composed of the LED wafer 10 and the support substrate 20. In attaching the LED wafer 10 to the support substrate 20, a wax or the like is applied to the front side 10a of the LED wafer 10, so as to improve an adhesion strength.

(Division Start Point Forming Step)

Figure 2:
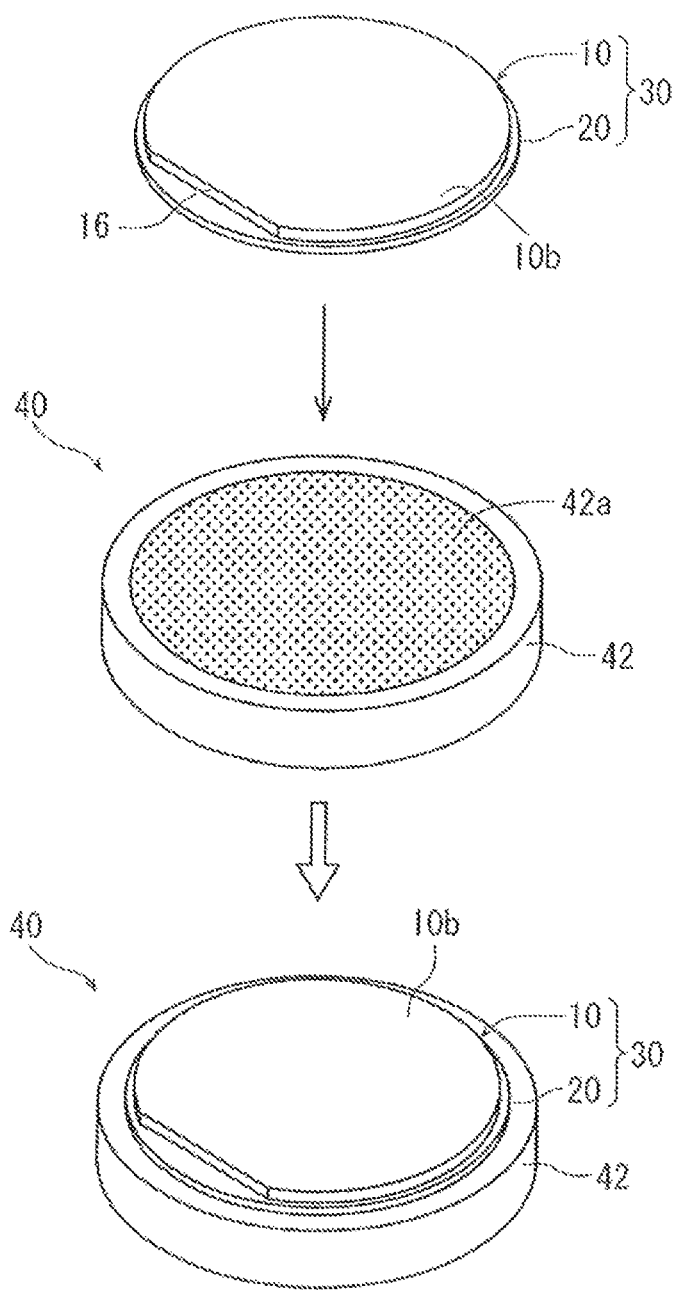
FIG. 2 is a perspective view illustrating a manner of holding the wafer unit illustrated in FIG. 1 on a holding table included in a laser processing apparatus.

After forming the wafer unit 30 by attaching the LED wafer 10 to the support substrate 20, a division start point forming step is performed to form a division start point along each division line 12. In performing the division start point forming step, the wafer unit 30 is transferred to a laser processing apparatus 40 illustrated in FIG. 2 (a part of the laser processing apparatus 40 being illustrated). The laser processing apparatus 40 includes a circular holding table 42 having a circular vacuum chuck 42a for holding the wafer unit 30 under suction. The wafer unit 30 transferred to the laser processing apparatus 40 is first placed on the vacuum chuck 42a of the holding table 42 in the condition where the support substrate 20 is oriented downward, that is, the back side 20b of the support substrate 20 is in contact with the upper surface of the vacuum chuck 42a. In this condition, the back side 10b of the LED wafer 10 of the wafer unit 30 placed on the holding table 42 is exposed upward. The vacuum chuck 42a is slightly smaller in diameter than the support substrate 20. The vacuum chuck 42a is connected to suction means (not illustrated) for producing a vacuum. In the above condition where the wafer unit 30 is placed on the vacuum chuck 42a, the suction means is operated to hold the wafer unit 30 on the vacuum chuck 42a under suction.

Figure 3A:
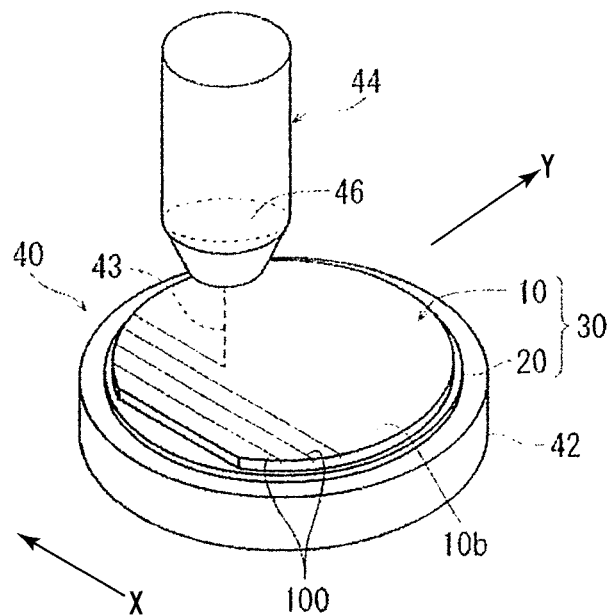
FIG. 3A is a perspective view illustrating a division start point forming step using the laser processing apparatus illustrated in FIG. 2.

As illustrated in FIG. 3A, the laser processing apparatus 40 further includes a laser beam applying unit 44, a part of which being illustrated. The laser processing apparatus 40 further includes a laser oscillator (not illustrated) for generating a laser beam LB having an absorption wavelength (266 nm) to the sapphire substrate. The laser beam applying unit 44 includes a focusing lens 46 for focusing the laser beam LB on the LED wafer 10. Accordingly, the laser beam LB generated from the laser oscillator is focused by the focusing lens 46 and then applied to the LED wafer 10 of the wafer unit 30 held on the holding table 42 under suction.

After holding the wafer unit 30 on the holding table 42 under suction, alignment means including an imaging camera (not illustrated) or the like in the laser processing apparatus 40 is used to perform alignment between the laser applying position where the laser beam LB is to be applied from the laser beam applying unit 44 and the position on the back side 10b of the LED wafer 10 corresponding to each division line 12.

Figure 3B:
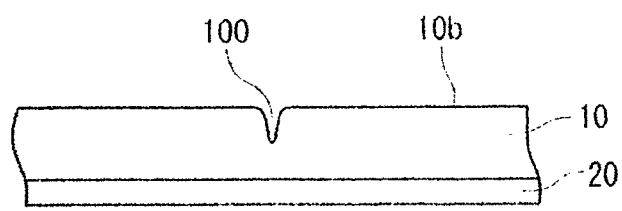
FIG. 3B is an enlarged side view of an essential part of the LED wafer illustrated in FIG. 3A.
Figure 3C:
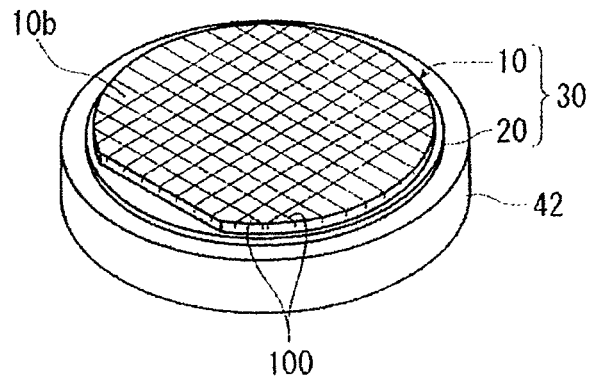
FIG. 3C is a perspective view illustrating the LED wafer processed by the division start point forming step.

After performing this alignment, the laser beam applying unit 44 is positioned above one end of a predetermined one of the division lines 12 extending in the first direction as a processing start position. Further, the focal position of the laser beam LB to be applied from the laser beam applying unit 44 is set on the back side 10b of the LED wafer 10. In this condition, the laser beam LB is applied from the laser beam applying unit 44 to the LED wafer 10 as moving the holding table 42 in the feeding direction illustrated by an arrow X in FIG. 3A at a feed speed of 90 mm/s, for example, thereby performing ablation to the back side 10b along an area corresponding to the predetermined division line 12. As a result, a laser processed groove 100 as a division start point is formed on the back side 10b of the LED wafer 10 along the area corresponding to the predetermined division line 12 as illustrated in FIG. 3B. Thereafter, the laser beam applying unit 44 is moved in the indexing direction illustrated by an arrow Y in FIG. 3A to the position above the next division line 12 adjacent to the above predetermined division line 12 along which the laser processed groove 100 has been formed. The indexing direction illustrated by the arrow Y is perpendicular to the feeding direction illustrated by the arrow X in a horizontal plane. Thereafter, the laser processing operation is similarly performed to the back side 10b of the LED wafer 10 along an area corresponding to this next division line 12 to thereby form a similar laser processed groove 100. In this manner, the laser processing operation is similarly performed along the areas corresponding to all of the other division lines 12 extending in the first direction to thereby form a plurality of similar laser processed grooves 100. Thereafter, the holding table 42 is rotated 90 degrees to similarly perform the laser processing operation along the areas corresponding to all of the other division lines 12 extending in the second direction perpendicular to the first direction, thereby forming a plurality of similar laser processed grooves 100 on the back side 10b of the LED wafer 10 along the areas corresponding to all of the other division lines 12 extending in the second direction. As a result, the plural laser processed grooves 100 are formed on the back side 10b of the LED wafer 10 along the areas corresponding to all of the crossing division lines 12 as illustrated in FIG. 3C. In this manner, the division start point forming step is completed.

For example, the division start point forming step is performed under the following laser processing conditions.
  Light source: YAG pulsed laser
  Wavelength: 266 nm (fourth harmonic of YAG laser)
  Repetition frequency: 50 kHz
  Pulse width: 10 ns
  Average power: 1 W
  Focused spot diameter: 10 μm
  Feed speed: 90 mm/s After performing the division start point forming step, a V-blade preparing step and a chamfering step are performed. In the V-blade preparing step, a V-blade having an annular cutting edge whose outer circumferential portion has a V-shaped cross section is prepared. In the chamfering step, the back side 10b of the LED wafer 10 is cut along each laser processed groove 100 by using the V-blade prepared above to thereby form a chamfered portion. The V-blade preparing step and the chamfering step will now be described with reference to FIGS. 4 to 7C.

(V-Blade Preparing Step)

Figure 4:
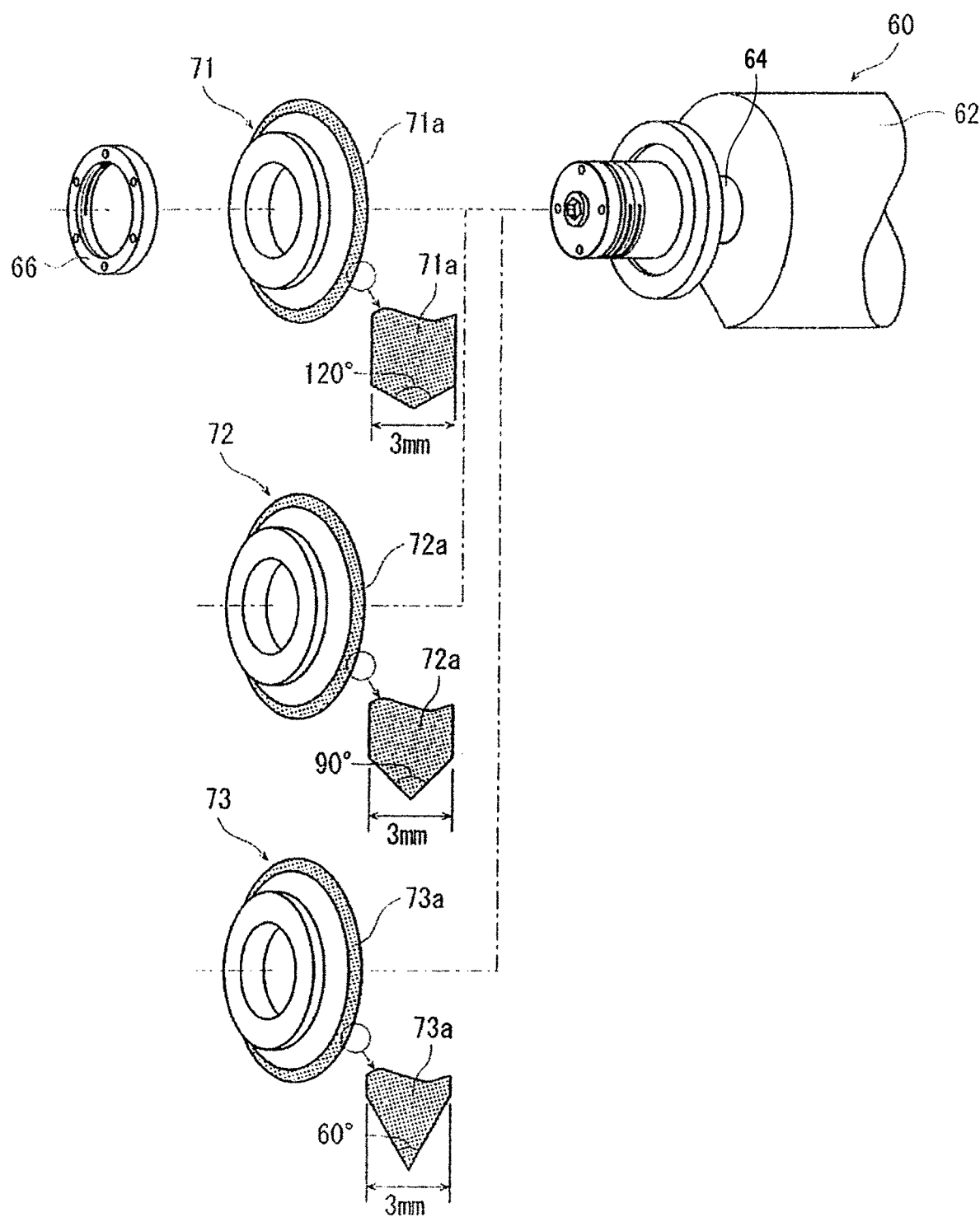
FIG. 4 is a perspective view illustrating a V-blade preparing step and a manner of selectively mounting a first V-blade, a second V-blade, and a third V-blade on a spindle included in a cutting apparatus.

As illustrated in FIG. 4, the V-blade preparing step is a step of preparing a V-blade having an annular cutting edge whose outer circumferential portion has a V-shaped cross section, in which the cutting edge is formed by fixing diamond abrasive grains with a metal bond or the like. More specifically, the V-blade is adapted to be mounted on the front end portion of a spindle 64 of a spindle unit 60 of a cutting apparatus 50 to be hereinafter described. The annular cutting edge of this V-blade has an outer diameter of 60 mm and a predetermined thickness of 3 mm, for example. Further, the diamond abrasive grains contained in the cutting edge of this V-blade preferably have an average grain size of #1800 to #2200, more preferably, #2000. In this preferred embodiment, this V-blade is composed of a first V-blade 71 having a first cutting edge 71a, a second V-blade 72 having a second cutting edge 72a, and a third V-blade 73 having a third cutting edge 73a. The outer circumferential portion of the first cutting edge 71a has a tip angle of 120 degrees as viewed in cross section. The outer circumferential portion of the second cutting edge 72a has a tip angle of 90 degrees as viewed in cross section. The outer circumferential portion of the third cutting edge 73a has a tip angle of 60 degrees as viewed in cross section. The first V-blade 71, the second V-blade 72, and the third V-blade 73 are adapted to be selectively mounted on the front end portion of the spindle 64. As illustrated in FIG. 4, the first, second, or third V-blade 71, 72, or 73 mounted on the spindle 64 is fixed by threadedly engaging a fastening nut 66 to the front end portion of the spindle 64.

After performing this V-blade preparing step, the chamfering step is performed to form a chamfered portion on the back side 10b of the LED wafer 10 along the laser processed groove 100 corresponding to each division line 12. The chamfering step will now be described with reference to FIGS. 5 to 7C.

(Chamfering step)

Figure 5:
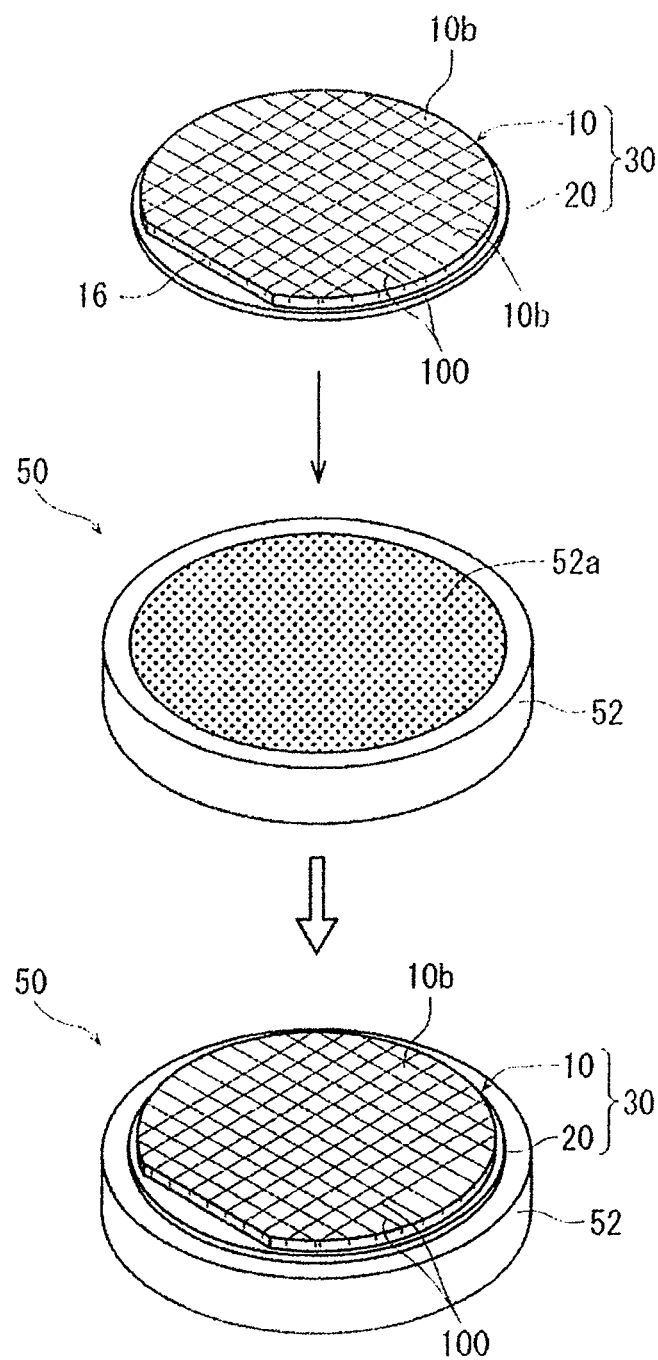
FIG. 5 is a perspective view illustrating a manner of holding the wafer unit illustrated in FIG. 3C on a holding table included in the cutting apparatus.
Figure 6:
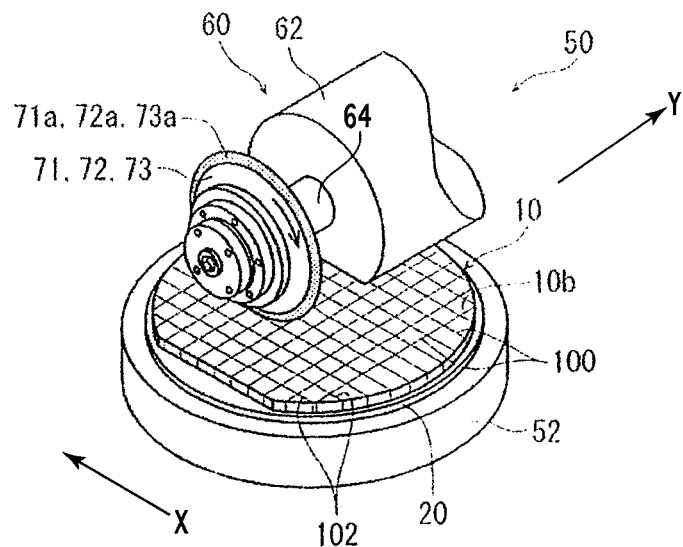
FIG. 6 is a perspective view illustrating a chamfering step using the first V-blade, the second V-blade, and the third V-blade illustrated in FIG. 4.

In performing the chamfering step, the wafer unit 30 is transferred to a cutting apparatus 50 for performing the chamfering step as illustrated in FIG. 5. The cutting apparatus 50 includes a holding table 52 having a vacuum chuck 52a for holding the wafer unit 30 under suction. The support substrate 20 of the wafer unit 30 is held on the vacuum chuck 52a of the holding table 52 under suction in the condition where the back side 10b of the LED wafer 10 is exposed upward as illustrated in FIG. 5. The cutting apparatus 50 further includes a spindle unit 60 as illustrated in FIG. 6. The spindle unit 60 includes a spindle housing 62 and a spindle 64 rotatably supported to the spindle housing 62. The spindle 64 is adapted to be rotationally driven by a rotational drive mechanism (not illustrated) provided in the spindle housing 62. The first V-blade 71 having the first cutting edge 71a having a tip angle of 120 degrees is first mounted on the front end portion of the spindle 64 of the spindle unit 60 in the cutting apparatus 50, thereby configuring cutting means chamfering the upper end of each laser processed groove 100 formed on the back side 10b of the LED wafer 10. After mounting the first V-blade 71 on the spindle 64, alignment means including an imaging camera (not illustrated) or the like in the cutting apparatus 50 is operated to perform alignment between the first V-blade 71 and the laser processed groove 100 formed on the back side 10b of the LED wafer 10 held on the holding table 52.

Figure 7A:
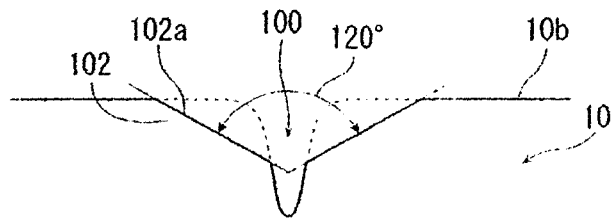
FIG. 7A is an enlarged side view of an essential part of the LED wafer chamfered by the first V-blade in the chamfering step.

After performing this alignment, the rotational drive mechanism for rotating the spindle 64 is operated to rotate the spindle 64 at a speed of 30,000 rpm, for example. Further, the first V-blade 71 is positioned above one end of a predetermined one of the laser processed grooves 100 respectively corresponding to the division lines 12 extending in the first direction as a chamfering start position, in which the laser processed grooves 100 are formed as division start points on the back side 10b of the LED wafer 10. Thereafter, the first V-blade 71 is lowered to cut the back side 10b of the LED wafer 10 until a predetermined depth from the back side 10b, e.g., a depth of 0.05 mm. At the same time, the holding table 52 is moved in the feeding direction illustrated by an arrow X in FIG. 6 at a feed speed of 5 mm/s, for example. Accordingly, the back side 10b of the LED wafer 10 is cut along the predetermined laser processed groove 100 by the first V-blade 71 to form a chamfered portion 102. More specifically, as illustrated in FIG. 7A, a first chamfered portion 102a constituting the chamfered portion 102 is formed at the upper end of the predetermined laser processed groove 100 formed on the back side 10b of the LED wafer 10 so as to form a tapering angle of 120 degrees. Thereafter, the first V-blade 71 is moved to the position above the next laser processed groove 100 adjacent to the above predetermined laser processed groove 100 in the indexing direction illustrated by an arrow Y in FIG. 6. Thereafter, the cutting operation using the V-blade 71 is similarly performed along this next laser processed groove 100 to form a similar chamfered portion 102a. In this manner, the cutting operation using the first V-blade 71 is similarly performed along all of the other laser processed grooves 100 corresponding to the division lines 12 extending in the first direction. Thereafter, the holding table 52 is rotated 90 degrees to similarly perform the cutting operation along all of the other laser processed grooves 100 corresponding to the division lines 12 extending in the second direction perpendicular to the first direction. As a result, a plurality of similar first chamfered portions 102a are formed along all of the laser processed grooves 100 corresponding to all of the crossing division lines 12, in which each first chamfered portion 102a has a depth of 0.05 mm and a tapering angle of 120 degrees.

Figure 7B:
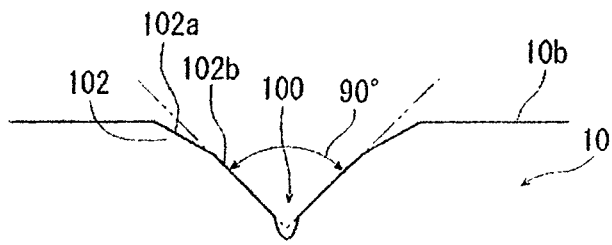
FIG. 7B is a view similar to FIG. 7A, illustrating a condition where the LED wafer has been further chamfered by the second V-blade.

After forming the first chamfered portions 102a along all of the laser processed grooves 100 formed on the back side 10b of the LED wafer 10 as illustrated in FIG. 7A, the rotation of the spindle 64 is once stopped and the spindle unit 60 is next raised. Thereafter, the first V-blade 71 is removed from the spindle 64, and the second V-blade 72 having the second cutting edge 72a having a tip angle of 90 degrees is next mounted on the spindle 64. After mounting the second V-blade 72 on the spindle 64, the depth of cut by the second V-blade 72 is increased by 0.05 mm from the depth of cut (=0.05 mm) by the first V-blade 71, that is, the depth of cut by the second V-blade 72 is set to 0.1 mm from the back side 10b of the LED wafer 10. In this condition, the back side 10b of the LED wafer 10 is similarly cut along each laser processed groove 100 by the second V-blade 72. That is, the upper end of each laser processed groove 100 previously chamfered by the first V-blade 71 is further chamfered by the second V-blade 72. As a result, a second chamfered portion 102b is formed along each laser processed groove 100 having the first chamfered portion 102a as illustrated in FIG. 7B. As apparent from the FIG. 7B, the second chamfered portion 102b is formed below the first chamfered portion 102a (i.e., toward the front side 10a of the LED wafer 10) along each laser processed groove 100 because the second cutting edge 72a having a tip angle of 90 degrees is used and the depth of cut by the second V-blade 72 is increased by 0.05 mm as mentioned above.

Figure 7C:
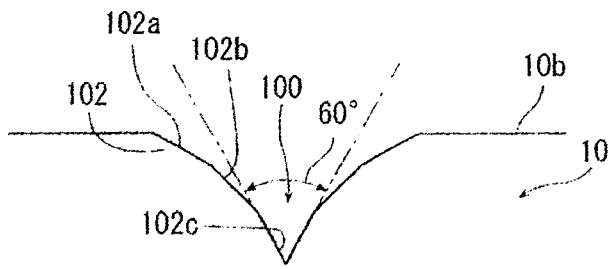
FIG. 7C is a view similar to FIG. 7B, illustrating a condition where the LED wafer has been further chamfered by the third V-blade.

After forming the second chamfered portion 102b along each laser processed groove 100 as mentioned above, the spindle 64 is stopped again and the spindle unit 60 is next raised. In this condition, the second V-blade 72 is removed from the spindle 64, and the third V-blade 73 having the third cutting edge 73a having a tip angle of 60 degrees is next mounted on the spindle 64. After mounting the third V-blade 73 on the spindle 64, the depth of cut by the third V-blade 73 is further increased by 0.05 mm from the depth of cut (=0.1 mm) by the second V-blade 72, that is, the depth of cut by the third V-blade 73 is set to 0.15 mm from the back side 10b of the LED wafer 10. In this condition, the back side 10b of the LED wafer 10 is similarly cut along each laser processed groove 100 by the third V-blade 73. That is, the upper end of each laser processed groove 100 previously chamfered by the second V-blade 72 is further chamfered by the third V-blade 73. As a result, a third chamfered portion 102c is formed along each laser processed groove 100 having the first chamfered portion 102a and the second chamfered portion 102b as illustrated in FIG. 7C. As apparent from FIG. 7C, the third chamfered portion 102c is formed below the second chamfered portion 102b (i.e., toward the front side 10a of the LED wafer 10) along each laser processed groove 100 because the third cutting edge 73a having a tip angle of 60 degrees is used and the depth of cut by the third V-blade 73 is further increased by 0.05 mm as mentioned above.

In this manner, the depth of cut in forming the chamfered portion 102 is stepwise increased to perform a cutting operation in plural stages, i.e., in three stages in this preferred embodiment. Accordingly, the chamfered portion 102 is composed of the first chamfered portion 102a, the second chamfered portion 102b, and the third chamfered portion 102c, which are continuously connected in this order to form a pseudo curved surface as a polygonal surface. In this preferred embodiment, the chamfered portion 102 is formed along each laser processed groove 100 as a division start point, so that each laser processed groove 100 is finally lost at the time the chamfering step is finished. However, the third chamfered portion 102c having an acute tip angle functions as a new division start point. In this manner, the chamfering step is completed. While the tip angles of the first, second, and third cutting edges 71a, 72a, and 73a are set to 120 degrees, 90 degrees, and 60 degrees, respectively, in this preferred embodiment, these angles are merely illustrative and they may suitably set in consideration of the finished shape of each chamfered portion 102. For example, the tip angle of the first cutting edge 71a of the first V-blade 71 is preferably selected in the range of 110 to 130 degrees. The tip angle of the second cutting edge 72a of the second V-blade 72 is preferably selected in the range of 80 to 100 degrees. The tip angle of the third cutting edge 73a of the third V-blade 73 is preferably selected in the range of 50 to 70 degrees. Further, the depth of cut to be stepwise increased in the chamfering step is not limited to 0.05 mm per stage, but it may be suitably adjusted. For example, the depth of cut to be stepwise increased in the chamfering step is preferably selected in the range of 0.04 to 0.06 mm per stage. Further, while the V-blade preparing step is performed just before performing the chamfering step in this preferred embodiment, the V-blade preparing step may be performed at any time before performing the chamfering step. For example, the V-blade preparing step may be performed before performing the division start point forming step.

(Dividing Step)

Figure 8:
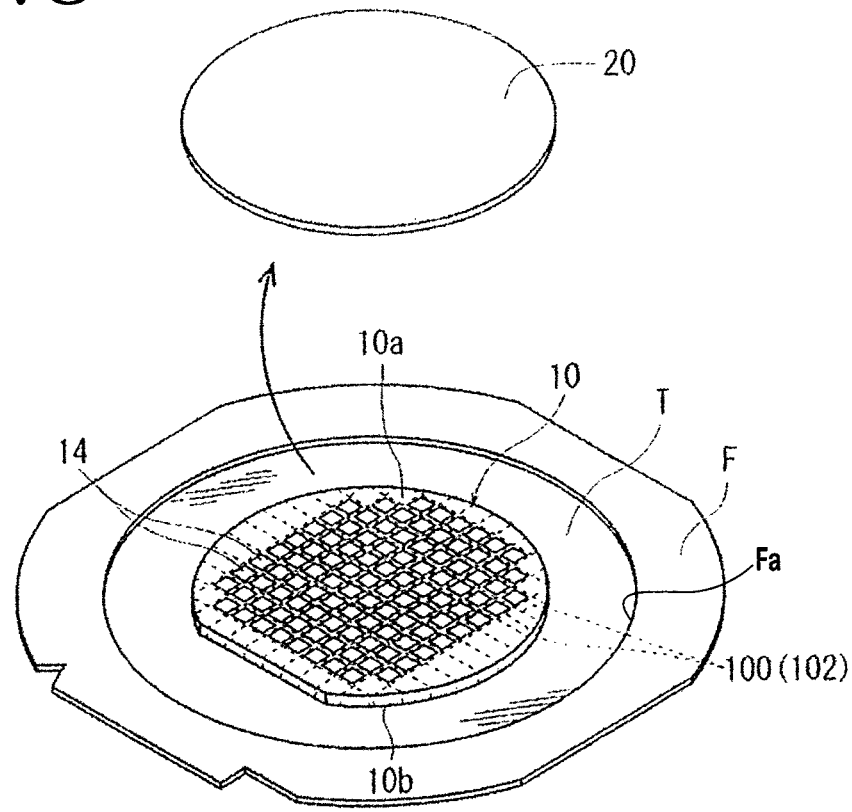
FIG. 8 is a perspective view illustrating a manner of supporting the LED wafer through a dicing tape to an annular frame after performing the chamfering step.

After performing the chamfering step, a dividing step is performed as required to divide the LED wafer 10 along each division line 12. In performing the dividing step, the LED wafer 10 is attached to a circular dicing tape T supported to an annular frame F as illustrated in FIG. 8. More specifically, the annular frame F has a circular inside opening Fa for accommodating the LED wafer 10. A peripheral portion of the dicing tape T is attached to the annular frame F, and the back side 10b of the LED wafer 10 is attached to a central portion of the dicing tape T so as to be located in the inside opening Fa of the annular frame F. The chamfered portion 102 has already been formed along each laser processed groove 100 as a division start point on the back side 10b of the LED wafer 10. After attaching the LED wafer 10 of the wafer unit 30 to the dicing tape T, the support substrate 20 is separated from the front side 10a of the LED wafer 10. As mentioned above, each laser processed groove 100 (each chamfered portion 102) is formed on the back side 10b of the LED wafer 10, so that each laser processed groove 100 is not exposed to the front side 10a of the LED wafer 10. However, each laser processed groove 100 can be seen from the front side 10a of the LED wafer 10 through the thickness thereof as illustrated by a broken line in FIG. 8.

After supporting the LED wafer 10 through the dicing tape T to the annular frame F, the dividing step is performed to divide the LED wafer 10 into a plurality of LED chips 14' (see FIG. 9) by expanding the dicing tape T attached to the LED wafer 10. The dividing step will now be described in more detail with reference to FIG. 9.

Figure 9:
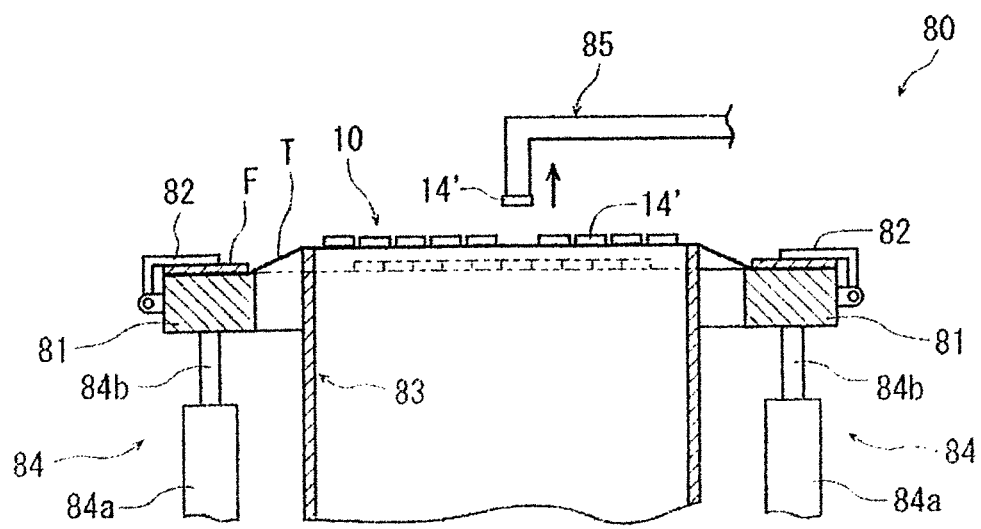
FIG. 9 is a partially sectional side view illustrating a dividing step of dividing the LED wafer illustrated in FIG. 8 into individual LED chips and also illustrating a pickup step of picking up each LED chip from the dicing tape.

First, the LED wafer 10 supported through the dicing tape T to the annular frame F is transferred to a dividing apparatus 80 illustrated in FIG. 9. The dividing apparatus 80 includes a frame holding member 81 having an annular shape, a plurality of clamps 82 provided on the outer circumference of the frame holding member 81 for clamping the annular frame F placed on the upper surface of the frame holding member 81, and a cylindrical expansion drum 83 surrounded by the frame holding member 81 for expanding the dicing tape T attached to the annular frame F held by the clamps 82. The expansion drum 83 is open at its upper end. The dividing apparatus 80 further includes a plurality of supporting means 84 arranged around the expansion drum 83 for vertically movably supporting the frame holding member 81 and a pickup collet 85 for picking up each LED chip 14' obtained by dividing the LED wafer 10. Each supporting means 84 is composed of an air cylinder 84a and a piston rod 84b extending upward from the air cylinder 84a. The upper end of each piston rod 84b is fixed to the lower surface of the frame holding member 81. Accordingly, when each air cylinder 84a is operated to vertically move each piston rod 84b, the frame holding member 81 is vertically moved. Further, suction means (not illustrated) is connected to the pickup collet 85, so that when the suction means is operated, the pickup collet 85 can hold each LED chip 14' under suction and pick it up from the dicing tape T.

The expansion drum 83 has an outer diameter smaller than the inner diameter of the annular frame F and has an inner diameter larger than the diameter of the LED wafer 10 supported through the dicing tape T to the annular frame F. Accordingly, the upper end of the expansion drum 83 is positioned below an annular exposed area of the dicing tape T as defined between the LED wafer 10 and the annular frame F. The frame holding member 81 is adapted to be vertically moved by the supporting means 84 so as to take an initial position where the upper surface of the frame holding member 81 is at substantially the same level as that of the upper end of the expansion drum 83 as illustrated by a broken line in FIG. 9 and an operative position where the frame holding member 81 is lowered from the initial position to thereby obtain a condition that the upper end of the expansion drum 83 is relatively higher in level than the upper surface of the frame holding member 81 as illustrated by a solid line in FIG. 9.

When the frame holding member 81 is lowered from the initial position to thereby relatively change the position of the upper end of the expansion drum 83 from the position illustrated by the broken line to the position illustrated by the solid line, the dicing tape T supported to the annular frame F is expanded by the upper end of the expansion drum 83. That is, the dicing tape T is an expandable tape adapted to be expanded by applying a tensile force thereto. As a result, an external force (tensile force) is applied to the LED wafer 10 attached to the dicing tape T in its radially outward direction. Accordingly, the LED wafer 10 is divided along each division line 12 where the laser processed groove 100 has been formed in the division start point forming step and the chamfered portion 102 has been formed in the chamfering step, thereby obtaining a plurality of LED chips 14' respectively including the plural LEDs 14. Thus, the dividing step is completed.

By performing the dividing step, the LED wafer 10 is divided into the plural LED chips 14' respectively including the plural LEDs 14 in the condition where any adjacent ones of the LED chips 14' are spaced from each other on the dicing tape T. In this condition, the pickup collet 85 is operated to hold each LED chip 14' under suction and then separate each LED chip 14' from the dicing tape T. Thereafter, each LED chip 14' is transferred to any apparatus for performing the next step or stored into a storing case (pickup step). Thus, the dividing step and the pickup step are completed. In this manner, the LED wafer processing method in this preferred embodiment is completed. Further, the sizes and angles illustrated in the drawings are suitably modified for convenience of illustration and they are not actual sizes and angles.

Each LED chip 14' obtained by this preferred embodiment has the chamfered portion 102 along the edge portion between the back side 10b and the side surface, so that the luminance of each LED chip 14' can be improved. Further, the cutting edge of each V-blade to be used in the chamfering step contains diamond abrasive grains having a small grain size of #1800 to #2200. Accordingly, each chamfered portion 102 has a polished surface. Further, each chamfered portion 102 is formed as a pseudo curved surface as a polygonal surface by using the plural V-blades having different tip angles, so that the luminance of each LED chip 14' can be further improved.

The present invention is not limited to the above preferred embodiment, but various modifications may be made. For example, in the above preferred embodiment, the chamfering step using the different V-blades 71, 72, and 73 is performed by using the same cutting apparatus 50 and selectively mounting these different V-blades 71, 72, and 73 on the spindle 64. As a modification, a plurality of cutting apparatuses may be prepared and these different V-blades 71, 72, and 73 may be respectively mounted in these plural cutting apparatuses. In this case, after finishing the chamfering step by using the first V-blade 71 mounted in the first cutting apparatus, the LED wafer 10 is transferred from the first cutting apparatus to the second cutting apparatus, and the chamfering step is next performed by using the second V-blade 72 mounted in the second cutting apparatus. After finishing the chamfering step by using the second V-blade 72 mounted in the second cutting apparatus, the LED wafer 10 is transferred from the second cutting apparatus to the third cutting apparatus, and the chamfering step is next performed by using the third V-blade 73 mounted in the third cutting apparatus.

Figure 3D:
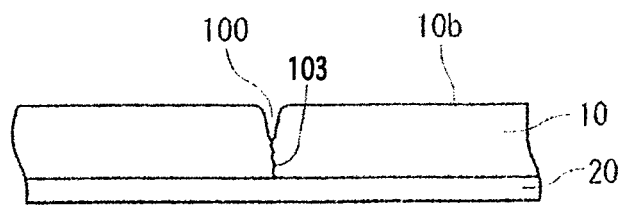
FIG. 3D is an enlarged side view of an essential part of the LED wafer in the case that the LED wafer is divided by forming a crack after performing the division start point forming step.

Further, in the division start point forming step according to the above preferred embodiment, the laser beam LB having an absorption wavelength to sapphire is applied to the back side 10b of the LED wafer 10 along the area corresponding to each division line 12, thereby performing ablation along the area corresponding to each division line 12 to thereby form the laser processed groove 100 as a division start point on the back side 10b of the LED wafer 10 along the area corresponding to each division line 12. As a modification, a pulsed laser beam having a transmission wavelength (532 nm) to sapphire may be applied to the back side 10b of the LED wafer 10 in the condition where the focal point of the pulsed laser beam is set inside the LED wafer 10 at the position corresponding to each division line 12, thereby forming a modified layer as a division start point inside the LED wafer 10 along each division line 12. Thereafter, the chamfering step may be performed to the back side 10b of the LED wafer 10 along the area corresponding to each modified layer. Also in this case, the dividing step may be similarly performed by using the dividing apparatus 80. That is, a radial tensile force may be applied to the LED wafer 10 to thereby divide the LED wafer 10 into the individual LED chips 14' because the modified layer and the chamfered portion are formed along each division line 12. However, in the case that ablation is performed in the division start point forming step, the side surface of each LED chip 14' obtained by performing the dividing step becomes a cleavage surface. Accordingly, as compared with the case of forming a modified layer inside the LED wafer 10, it can be expected that the luminance of each LED chip 14' is improved more. Further, the laser beam LB may be applied to the front side 10a of the LED wafer 10 in the division start point forming step. In this case, the chamfering step may be performed to the back side 10b of the LED wafer 10 before performing the division start point forming step. That is, after performing the chamfering step, the laser beam may be applied to the front side 10a of the LED wafer 10 to thereby form a laser processed groove or a modified layer as a division start point along each division line 12. Thereafter, the dividing step may be performed. Further, in the above preferred embodiment, the LED wafer 10 is divided into the individual LED chips 14' after performing the chamfering step. As a modification, after performing the division start point forming step, a crack 103 may be formed in the LED wafer 10 so as to extend from each laser processed groove 100 to the front side 10a of the LED wafer 10 as illustrated in FIG. 3D, by applying an external force to the LED wafer 10. Accordingly, the LED wafer 10 can be divided into the individual LED chips 14'. Thereafter, the chamfering step may be performed to the back side 10b of the LED wafer 10 along each laser processed groove 100.

In the above preferred embodiment, the chamfering step is performed by using the three kinds of V-blades, that is, the first V-blade 71 having a tip angle of 120 degrees, the second V-blade 72 having a tip angle of 90 degrees, and the third V-blade 73 having a tip angle of 60 degrees. However, this configuration is merely illustrative and the chamfering step may be performed by using one kind of V-blade having a suitable tip angle. Further, the chamfering step may be performed by using two kinds of V-blades having different tip angles or by using four or more kinds of V-blades having different tip angles. In this manner, in the case of performing the chamfering step by using a plurality of kinds of V-blades having different tip angles, the tip angles may be suitably adjusted according to the number of the plural V-blades. Owing to the use of the plural V-blades having different tip angles in performing the chamfering step, the chamfered portion 102 can be made into a pseudo curved surface as a polygonal surface, thereby contributing to an improvement in luminance of each LED chip 14'.

The above-mentioned processing conditions including the rotational speed of the spindle 64, the depth of cut to be stepwise increased, and the feed sped in the chamfering step are merely illustrative and it is needless to say that they may be suitably adjusted.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A light-emitting diode wafer processing method for processing a light-emitting diode wafer formed from a sapphire substrate having a front side, a plurality of crossing division lines being formed on the front side of the sapphire substrate to thereby define a plurality of separate regions where a plurality of light-emitting diodes are respectively formed, the light-emitting diode wafer processing method comprising:
    a groove forming step of forming a groove in a back side of the wafer along an area corresponding to each division line;
    a V-blade preparing step of preparing a plurality of V-blades, each having an annular cutting edge whose outer circumferential portion has a V-shaped cross section; and
    a chamfering step of rotatably mounting a first V-blade of the plurality of V-blades in cutting means, holding the light-emitting diode wafer on a holding table in a condition where the back side of the light-emitting diode wafer is exposed upward, and then relatively moving the cutting means and the holding table to form a first chamfered portion in the groove on the back side of the light-emitting diode wafer along the area corresponding to each division line formed on the front side of the light-emitting diode wafer, and
    mounting a second V-blade of the plurality of V-blades in the cutting means, and then relatively moving the cutting means and the holding table to form a second chamfered portion in the first chamfered portion of the groove on the back side of the light-emitting diode wafer along the area corresponding to each division line formed on the front side of the light-emitting diode wafer.

2. The light-emitting diode wafer processing method according to claim 1, wherein
    the plurality of V-blades have a plurality of annular cutting edges whose outer circumferential portions have different V-shaped cross sections such that the plurality of annular cutting edges of the plurality of V-blades have different tip angles, and
    the chamfering step is performed by stepwise mounting the plurality of V-blades in the cutting means to form a polygonal surface in the groove as the chamfered portion on the back side of the light-emitting diode wafer.

3. The light-emitting diode wafer processing method according to claim 1, wherein
    the plurality of V-blades comprise three kinds of V-blades having three kinds of cutting edges, and
    the different tip angles of the three kinds of cutting edges comprise a first tip angle of 110 to 130 degrees, a second tip angle of 80 to 100 degrees, and a third tip angle of 50 to 70 degrees.

4. The light-emitting diode wafer processing method according to claim 1, wherein the cutting edge of at least one of the plurality of V-blades contains diamond abrasive grains having an average grain size of #1800 to #2200.

5. The light-emitting diode wafer processing method according to claim 1, wherein the depth of cut by the plurality of V-blades is stepwise increased in the chamfering step every time the V-blades are stepwise mounted in the cutting means, thereby cutting the back side of the light-emitting diode wafer along each division line in plural stages.

6. The light-emitting diode wafer processing method according to claim 5, wherein the depth of cut to be stepwise increased in the chamfering step is set in a range of 0.04 to 0.06 mm per stage.

7. The light-emitting diode wafer processing method according to claim 1, further comprising:
a division start point forming step of forming a division start point along each division line of the light-emitting diode wafer before or after performing the chamfering step.

8. The light-emitting diode wafer processing method according to claim 1, further comprising a step of attaching a front side of the light-emitting diode wafer to a support substrate prior to the groove forming step.

9. The light-emitting diode wafer processing method according to claim 8, wherein the support substrate is formed of polyethylene terephthalate.

10. The light-emitting diode wafer processing method according to claim 1, wherein a width of each of said plurality of V-blades is the same.

11. A light-emitting diode wafer processing method for processing a light-emitting diode wafer formed from a sapphire substrate having a front side, a plurality of crossing division lines being formed on the front side of the sapphire substrate to thereby define a plurality of separate regions where a plurality of light-emitting diodes are respectively formed, the light-emitting diode wafer processing method comprising:
a division start point forming step of forming a division start point along each division line of the light-emitting diode wafer;
a V-blade preparing step of preparing a plurality of V-blades, each having an annular cutting edge whose outer circumferential portion has a V-shaped cross section; and
a chamfering step of rotatably mounting a first V-blade of the plurality of V-blades in cutting means, holding the light-emitting diode wafer on a holding table in a condition where the back side of the light-emitting diode wafer is exposed upward, and then relatively moving the cutting means and the holding table to form a first chamfered portion in a groove on the back side of the light-emitting diode wafer along the area corresponding to each division line formed on the front side of the light-emitting diode wafer, after performing the division start point forming step, and
mounting a second V-blade of the plurality of V-blades in the cutting means, and then relatively moving the cutting means and the holding table to form a second chamfered portion in the first chamfered portion of the groove on the back side of the light-emitting diode wafer along the area corresponding to each division line formed on the front side of the light-emitting diode wafer.

12. The light-emitting diode wafer processing method according to claim 11, wherein the division start point forming step comprises applying a pulsed laser beam having a transmission wavelength to the back side of the light-emitting diode wafer in a condition where the focal point of the pulsed laser beam is set inside the light-emitting diode wafer at the position corresponding to each division line, thereby forming a modified layer as a division start point inside the light-emitting diode wafer along each division line.

13. A light-emitting diode wafer processing method for processing a light-emitting diode wafer formed from a sapphire substrate having a front side, a plurality of crossing division lines being formed on the front side of the sapphire substrate to thereby define a plurality of separate regions where a plurality of light-emitting diodes are respectively formed, the light-emitting diode wafer processing method comprising:
a groove forming step of forming a groove in a back side of the wafer along an area corresponding to each division line;
a V-blade preparing step of preparing a plurality of V-blades, each having an annular cutting edge whose outer circumferential portion has a V-shaped cross section;
a first chamfering step of forming a first chamfered portion on the back side of the light-emitting diode wafer along an area corresponding to each division line formed on the front side of the light-emitting diode wafer by using a first V-blade having a first tip angle; and
a second chamfering step of forming a second chamfered portion in the first chamfered portion of the groove on the back side of the light-emitting diode wafer along the area corresponding to each division line formed on the front side of the light-emitting diode wafer by using a second V-blade having a second tip angle smaller that the tip angle of the first V-blade.

14. The light-emitting diode wafer processing method according to claim 13, wherein the first tip angle is 110 to 130 degrees and the second tip angle is 80 to 100 degrees.

\* \* \* \* \*